US009780777B1

(12) United States Patent
Ali

(10) Patent No.: US 9,780,777 B1
(45) Date of Patent: Oct. 3, 2017

(54) METHODS AND APPARATUS FOR LEVEL-SHIFTING HIGH SPEED SERIAL DATA WITH LOW POWER CONSUMPTION

(71) Applicant: MediaTek Inc., Hsin-Chu (TW)

(72) Inventor: Tamer Ali, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/248,173

(22) Filed: Aug. 26, 2016

Related U.S. Application Data

(60) Provisional application No. 62/317,883, filed on Apr. 4, 2016.

(51) Int. Cl.
*H03K 17/687* (2006.01)

(52) U.S. Cl.
CPC ................... *H03K 17/687* (2013.01)

(58) Field of Classification Search
USPC ................ 327/108–110, 333, 423–424, 588
See application file for complete search history.

(56) References Cited

U.S. PATENT DOCUMENTS

| 5,773,999 A * | 6/1998 | Park | G11C 7/1051 326/27 |
| 7,253,655 B2 * | 8/2007 | Kwon | H03L 7/00 326/29 |
| 8,674,747 B2 * | 3/2014 | Iwasaki | H03K 19/018571 327/108 |

OTHER PUBLICATIONS

Song et al., A 6-Gbit/s Hybrid Voltage-Mode Transmitter With Current-Mode Equalization in 90-nm CMOS, IEEE Transactions on Circuits and Systems—II: Express Briefs, vol. 89, No. 8 (Aug. 2012).

* cited by examiner

*Primary Examiner* — An Luu
(74) *Attorney, Agent, or Firm* — Wolf, Greenfield & Sacks, P.C.

(57) ABSTRACT

A driver circuit for driving a transmission line, such as a cable or a metal trace on a printed circuit board is described. The driver may be configured to drive lines with voltages exceeding the maximum voltage than a transistor can withstand for a given fabrication node. The driver may be configured to receive a supply voltage larger than that indicated by manufacturers. The driver may use a fast path and a slow path. Signals provided by the slow path and the fast path may be combine to adapt the input signals to levels that do cause stress to a transistor. A plurality of drivers of the type described herein may be used to provide digital-to-analog conversion.

20 Claims, 6 Drawing Sheets

US 9,780,777 B1

METHODS AND APPARATUS FOR LEVEL-SHIFTING HIGH SPEED SERIAL DATA WITH LOW POWER CONSUMPTION

RELATED APPLICATIONS

This application claims priority under 35 U.S.C. §119(e) to U.S. Provisional Application Ser. No. 62/317,883, entitled "METHOD AND APPARATUS FOR LEVEL-SHIFTING HIGH SPEED SERIAL DATA WITH LOW POWER CONSUMPTION" filed on Apr. 4, 2016, which is herein incorporated by reference in its entirety.

BACKGROUND

Line drivers are used in electronics to transmit signals through transmission lines. Types of line drivers include voltage mode drivers and current mode drivers.

SUMMARY

One aspect of the present application provides a circuit. The circuit may comprise a first transistor having a first control terminal and a first output terminal; a second transistor having a second control terminal and a second output terminal; a third transistor having a third output terminal coupled to the first output terminal; a fourth transistor having a fourth output terminal coupled to the second output terminal; a first driving stage connected to the first control terminal, the first driving stage comprising a first driver having a first speed and a second driver having a second speed slower than the first speed; and a second driving stage connected to the second control terminal, the second driving stage comprising a third driver having a third speed and a fourth driver having a fourth speed slower than the third speed.

Another aspect of the present application provides a circuit. The circuit may comprise a first transistor having a control terminal and a first output terminal; a second transistor having a second output terminal coupled to the first output terminal; and a driving stage connected to the control terminal, the driving stage comprising a first driver having a first speed and a second driver having a second speed slower than the first speed.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Voltage mode drivers have the advantage of consuming less power, compared to some other types of line drivers. Accordingly, voltage mode drivers are used to drive transmission lines in a variety of applications. However, the inventor has appreciated a challenge in the design of voltage mode drivers that has arisen as the size of integrated transistors decreases (e.g., at smaller transistor fabrication "nodes"). In particular, smaller transistors may be less able to handle the voltage stresses needed to drive the required voltages on a transmission line. Applying a voltage to the transistors greater than that which they are designed to withstand risks damage to the transistors and/or may cause unacceptably high leakage current. However, smaller fabrication nodes provide the opportunity to drive electronic circuits at higher data rates. Accordingly, as the demand for bandwidth increases, circuit designers have an incentive to migrate to smaller fabrication nodes.

Figure 1:
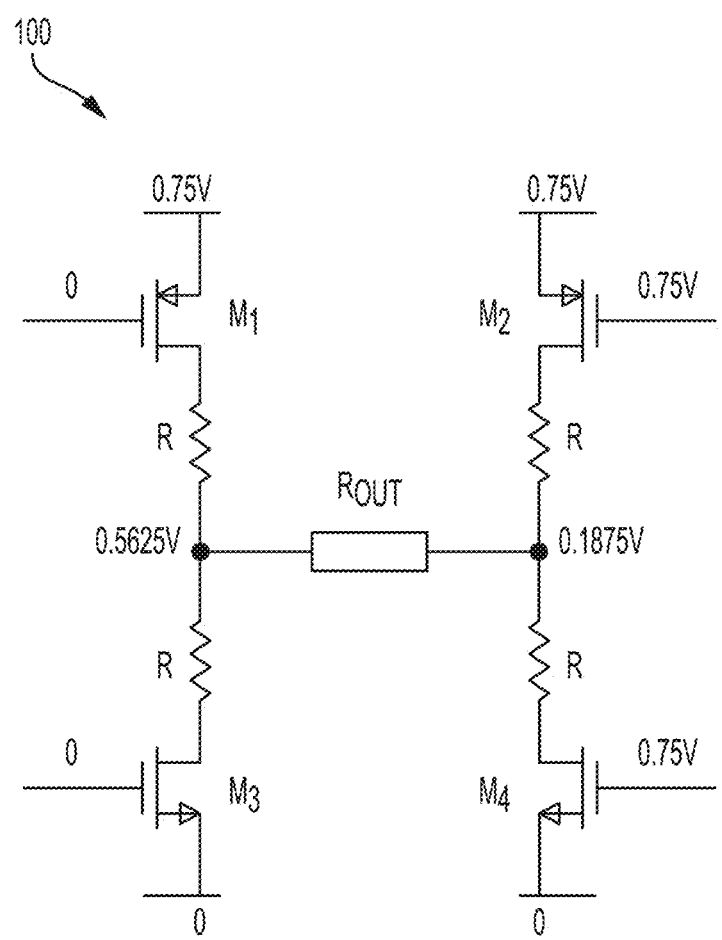
FIG. 1 is a circuit diagram illustrating a line driver.

FIG. 1 shows an example of a voltage mode driver 100. Voltage mode driver 100 includes transistors $M_1$, $M_2$, $M_3$ and $M_4$ and four resistors R. Resistor $R_{out}$ represents the impedance of the transmission line driven by the voltage mode driver 100. The voltage used to drive a signal through a transmission line is often specified by a standard. A transmission line voltage level specified according to a standard will be referred to herein as the "line level." As an example, a standard may specify a line level of 1V peak-to-peak (1Vpp). To supply a line level of 1Vpp, the voltage mode driver 100 needs to have the capability of producing a voltage of 1V across $R_{out}$. To do so, the supply voltage of the voltage mode driver 100 needs to be at least 1V. However, fabrication nodes are decreasing in size to the point where the transistors are no longer capable of withstanding a supply voltage of 1V. As an example, a manufacturer may specify that the maximum voltage that can be supplied to a transistors fabricated using a 16 nm-fabrication node is 1.05V. As another example, a manufacturer may specify that the maximum voltage that can be supplied to a circuit fabricated using a 7 nm-fabrication node is 0.75V. Providing a voltage to the transistor (e.g., across the gate and source of a MOSFET) higher than the maximum specified by the manufacturer risks causing damage to the transistors and/or high leakage current. Reducing the supply voltage may not be an acceptable solution, as reducing the supply voltage of voltage mode driver 100 does not allow supplying a signal of 1Vpp.

FIG. 1 illustrates applying a supply voltage of 0.75V to voltage mode driver 100. In this example, the resistance of resistors R is 50Ω and $R_{out}$ has an impedance of 100Ω. Transistors $M_1$ and $M_2$ are PMOS transistors, and $M_3$ and $M_4$ are NMOS transistors. The drain of each transistor is coupled to a terminal of $R_{out}$ through a resistor R. The sources of transistors $M_1$ and $M_2$ are provided with a 0.75V supply voltage, which is equal to the maximum supply voltage specified by the manufacturer, and the sources of transistors $M_3$ and $M_4$ are grounded. If the gates of transistors $M_1$ and $M_3$ are driven with zero voltage and transistors $M_2$ and $M_4$ are driven with 0.75V, the voltages appearing at the terminals of $R_{out}$ are equal to 0.5625V and 0.1875V respectively. In this case, the voltage difference at the terminals of $R_{out}$ is 0.5625V−0.1875V=0.375V. In case of driving a signal of opposite polarity, the voltage across the terminals of $R_{out}$ are equal to 0.1875V and 0.5625V respectively. In this case, the voltage difference at the terminals of $R_{out}$ is 0.1875V−0.5625V=−0.375V. Toggling between −0.375V and 0.375V, $R_{out}$ exhibits a 0.75Vpp.

The present inventor has developed circuits and associated techniques that allow supplying the desired line voltage while keeping the voltage of the transistors(s) within their voltage limits. In some embodiments, the supply voltage can exceed the voltage limits of the transistors. To allow the transistors to withstand the supply voltage, a control signal is applied to a control terminal of a transistor through parallel control paths (e.g., fast and slow control paths) that respond to the control signal with different speeds. The way in which the parallel control paths allow the transistors to withstand the voltage will be described with reference to FIG. 2.

Figure 2:
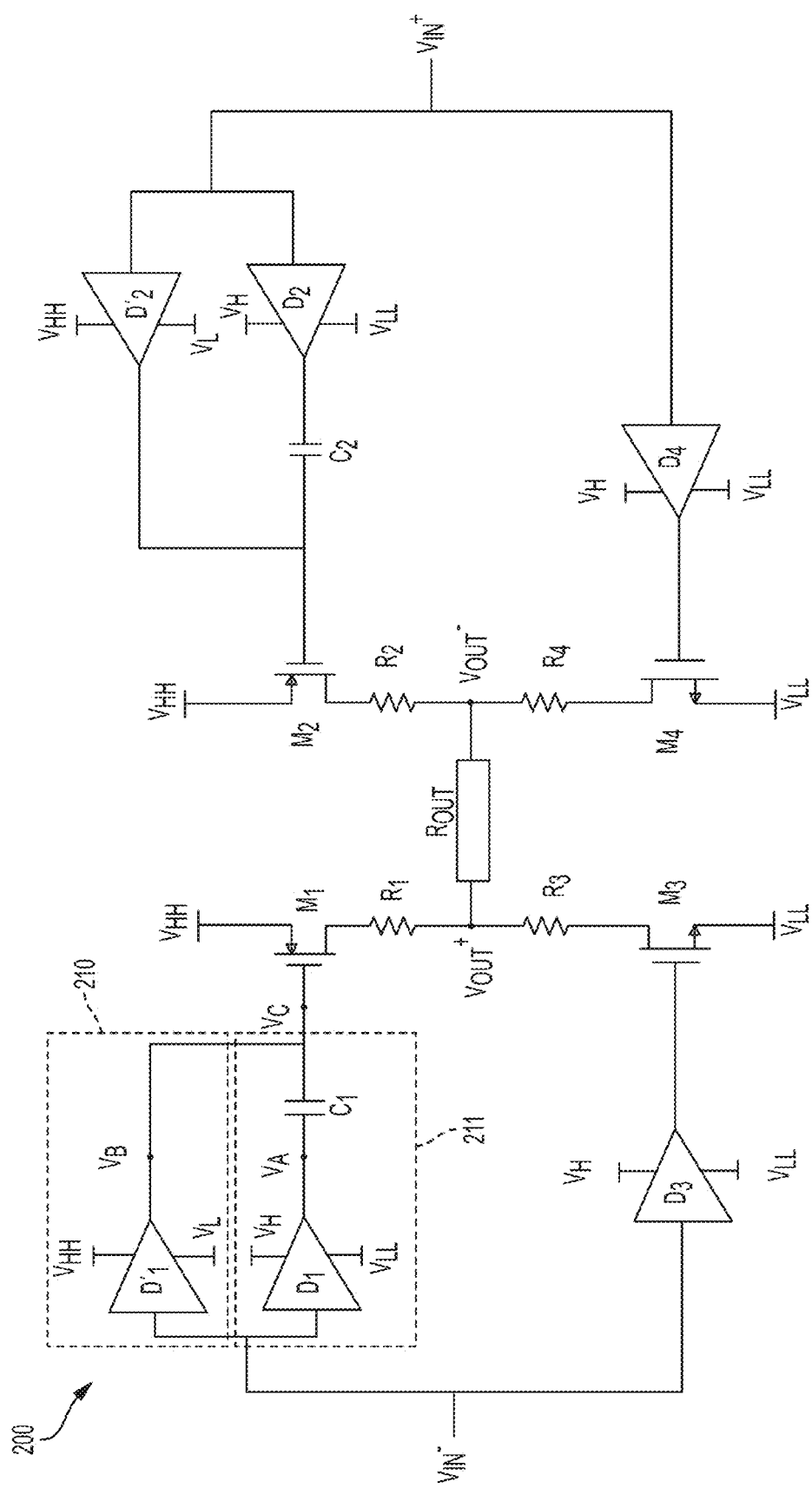
FIG. 2 is a circuit diagram illustrating a line driver, according to some embodiments.

FIG. 2 is a block diagram illustrating a line driver 200 with parallel control paths of different speeds, according to some embodiments. Line driver 200 includes transistors $M_1$, $M_2$, $M_3$ and $M_4$, resistors $R_1$, $R_2$, $R_3$ and $R_4$, drivers $D_1$, $D_2$, $D_1'$, $D_2'$, $D_3$ and $D_4$ and capacitors $C_1$ and $C_2$. Driver $D_1'$ serves as slow control path 210, and driver $D_1$ and capacitor $C_1$ serve as fast control path 211. In some embodiments, transistor $M_1$ and $M_2$ are PMOS transistors, and $M_3$ and $M_4$ are NMOS transistors. However, the present invention is not limited to MOS transistors, and any other suitable type of transistor may be used, including bipolar junction transistors (BJT), heterojunction bipolar transistor (HBT), junction field effect transistor (JFET), etc. The transistors of line driver 200 may be fabricated using any suitable fabrication node, such as less than or equal to 45 nm, less than equal to 32 nm, less than equal to 22 nm, less than equal to 16 nm, less than equal to 14 nm, less than equal to 10 nm, less than equal to 7 nm or less than equal to 5 nm.

Transistors $M_3$ and $M_4$ may be coupled to supply voltage $V_{LL}$, for example, through the respective source terminals, while transistors $M_1$ and $M_2$ may be coupled to supply voltage $V_{HH}$, through the respective source terminals, for example. In some embodiments, the drain of transistor $M_1$ may be coupled to the output terminal labeled $V_{out}^+$ through resistor $R_1$, and the drain of transistor $M_3$ may be coupled to $V_{out}^+$ through resistor $R_3$. In some embodiments, the drain of transistor $M_2$ may be coupled to the output terminal labeled $V_{out}^-$ through resistor $R_2$, and the drain of transistor $M_4$ may be coupled to $V_{out}^-$ through resistor $R_4$. Output terminals $V_{out}^+$ and $V_{out}^-$ may be coupled to respective conductors of a transmission line. Examples of a transmission line that may be driven by the line driver 200 include the wires of a twinax cable, or a pair of metal traces disposed on a printed circuit board, by way of example and not limitation. In some embodiments, the transmission line may exhibit a impedance equal to 50Ω, 75Ω, 80Ω or 100Ω. However, transmission lines exhibiting any other suitable resistance may be coupled to line driver 200.

Each driver may receive an input signal, and in response, may place the corresponding transistor in a on or off state. An "on state" is referred to herein to either indicate an NMOS transistor having a gate/source voltage $V_{GS}$ greater than or equal to the threshold voltage, or a PMOS transistor having a source/gate voltage $V_{SG}$ greater than or equal to the absolute value of the threshold voltage. Contrarily, an "off state" is referred to herein to either indicate an NMOS transistor having a gate/source voltage $V_{GS}$ less than the threshold voltage or a PMOS transistor having a source/gate voltage $V_{SG}$ less than the absolute value of the threshold voltage.

The gate of transistor $M_1$ may be coupled to the output of driver $D_1$, through capacitor $C_1$, and to the output of driver $D_1'$, and the gate of transistor $M_2$ may be coupled to the output of driver $D_2$, through capacitor $C_2$, and to the output of driver $D_2'$. The gate of transistor $M_3$ may be coupled to the output of driver $D_3$ and the gate of transistor $M_4$ may be coupled to the output of driver D4. Drivers $D_1$, $D_1'$ and $D_3$ may be configured to receive input signal $V_{in}^-$, and drivers $D_2$, $D_2'$ and $D_4$ may be configured to receive input signal $V_{in}^+$. Input signals $V_{in}^+$ and $V_{in}^-$ may toggle between $V_{LL}$ and $V_H$. Input signals $V_{in}^+$ and $V_{in}^-$ may represent a differential signal in some embodiments. Drivers $D_1$ and $D_2$ may be configured to receive voltage supplies $V_H$ and $V_{LL}$, while drivers $D_1'$ and $D_2'$ may be configured to receive voltage supplies $V_{HH}$ and $V_L$.

In some embodiments, fast control path 211 may have a first speed, and fast control path 210 may have a second speed, less than the first speed. For example, fast control path 211 may be configured to track signals that vary at a frequency up to 60 GHz, and slow control path 210 may be configured to track signals that vary at a frequency up to 1 GHz.

In some embodiments, the line driver 200 may be configured to receive a supply voltage greater that the maximum voltage for the particular fabrication node utilized. As an example, line driver 200 may be fabricated using a fabrication node such that only voltages no greater than 0.75V can be withstood. Nevertheless, the line driver 200 may receive a 1V supply voltage, and may drive transmission lines with a 1Vpp. As will be described further below, the use of a fast control path and a slow control path to drive the signals allows the line driver to withstand the voltage in excess.

Figure 3A:
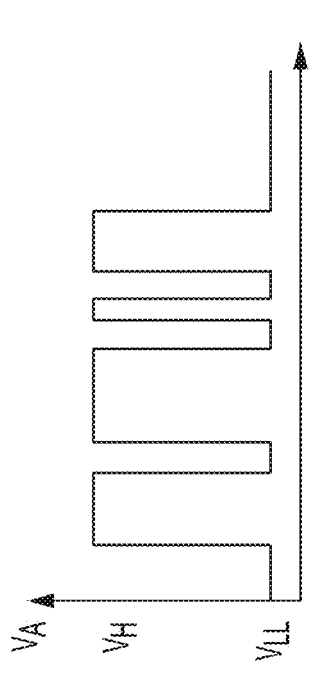
FIG. 3A is a plot illustrating an exemplary input signal, according to some embodiments.
Figure 3B:
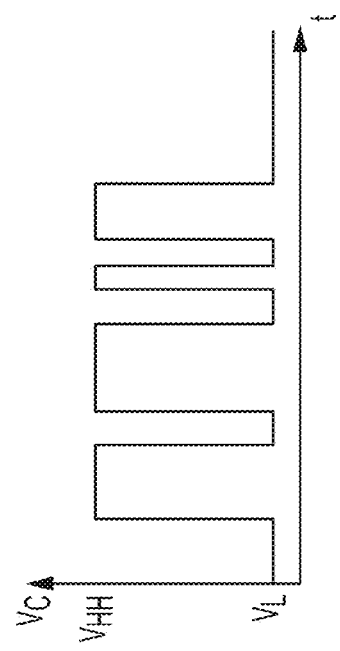
FIG. 3B is a plot illustrating an exemplary waveform provided at node A of the line driver of FIG. 2, according to some embodiments.
Figure 3C:
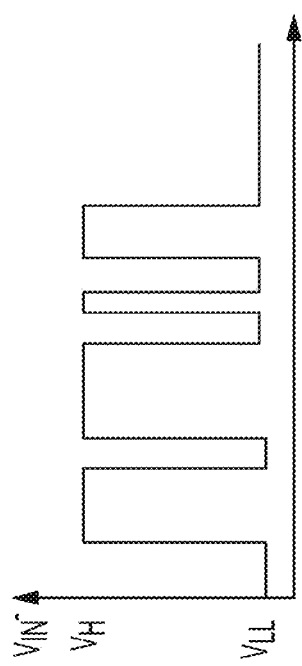
FIG. 3C is a plot illustrating an exemplary waveform provided at node B of the line driver of FIG. 2, according to some embodiments.

By way of example and not limitation, $V_{in}^-$ may exhibit a succession of logic 0s, represented by the voltage $V_H$, and 1s, represented by the voltage $V_{LL}$, as illustrated in FIG. 3A. In response to receiving $V_{in}^-$, driver $D_1$ may output signal $V_A$, illustrated in FIG. 3B. Driver $D_1$ may be configured to output a signal that tracks $V_{in}^-$. Accordingly, signal $V_A$ may exhibit a succession of logic 0s, represented by the voltage $V_H$, and 1s, represented by the voltage $V_{LL}$, that tracks the succession provided by $V_{in}^-$. Having a lower speed, driver $D_1'$ may not be fast enough to track $V_{in}^-$, and may output a signal $V_B$ that varies at a slower rate with respect to $V_A$, as shown in FIG. 3C, which illustrates a non-limiting example of signal $V_B$.

Figure 4A:
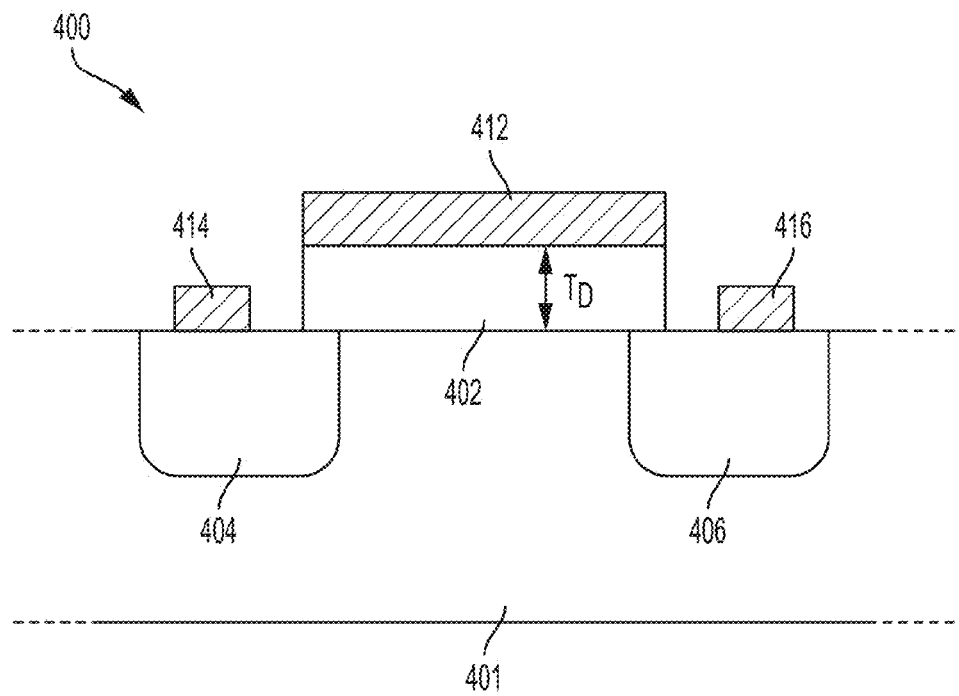
FIG. 4A-4B are schematic diagrams illustrating exemplary transistors having different gate dielectric thicknesses, according to some embodiments.
Figure 4B:
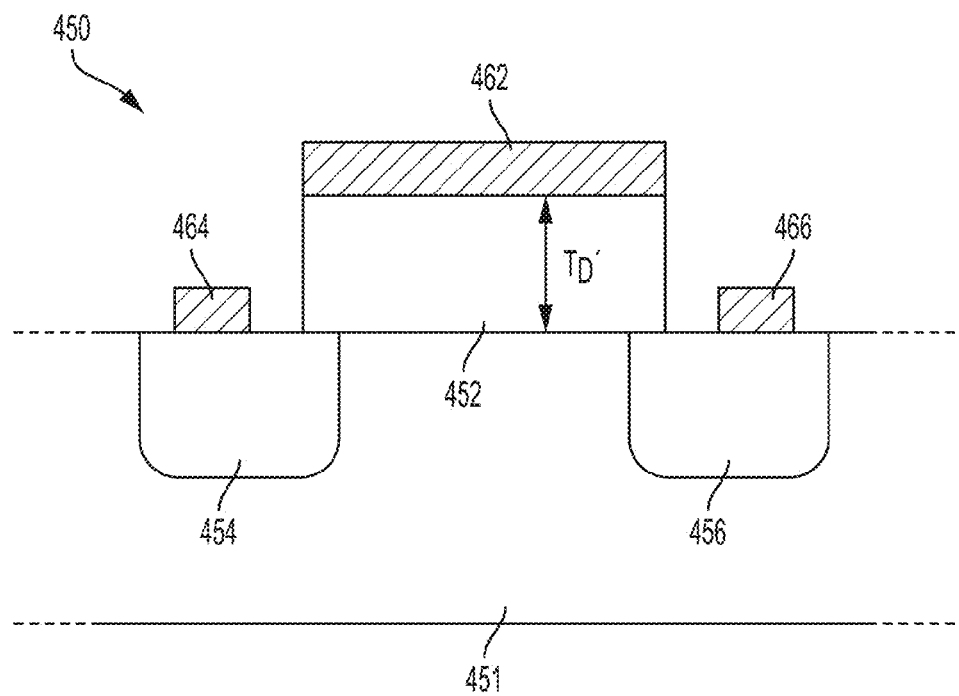

In some embodiments, to provide a slower speed, driver $D_1'$ may comprise transistor(s) having a gate dielectric layer that is thicker than the gate dielectric layer used in driver $D_1$. Having a thicker gate dielectric, the transistor(s) of driver $D_1'$ may be configured to withstand voltages greater than $V_H$-$V_{LL}$. FIG. 4A-4B are schematic diagrams illustrating two MOSFET transistors having different gate dielectric thicknesses. Transistor 400 of FIG. 4A, may be used within driver $D_1$ while transistor 450 of FIG. 4B may be used within driver $D_1'$.

Transistor 400 may comprise substrate 401, source doped well 404, drain doped well 406, gate dielectric 402, source terminal 414, gate terminal 412 and drain terminal 416. Substrate 401 may be a common substrate shared by a plurality of transistors of the type of transistor 400. Source terminal 414 may be disposed in correspondence with source doped well 404 and drain terminal 416 may be disposed in correspondence with drain doped well 406. Gate dielectric 402 may be disposed between gate terminal 412 and substrate 401. Gate dielectric 402 may comprise silicon oxide in some embodiments. Gate dielectric 402 may have a thickness $T_D$, which may be between 1 nm and 50 nm in some embodiments.

Transistor 450 may comprise substrate 451, source doped well 454, drain doped well 456, gate dielectric 452, source terminal 464, gate terminal 462 and drain terminal 466. Substrate 451 may be a common substrate shared by a plurality of transistors of the type of transistor 450. Source terminal 464 may be disposed in correspondence with source doped well 454 and drain terminal 466 may be disposed in correspondence with drain doped well 456. Gate dielectric 452 may be disposed between gate terminal 462 and substrate 451. Gate dielectric 452 may comprise silicon oxide in some embodiments. Gate dielectric 452 may have a thickness $T_D'$, which may be between 1 nm and 50 nm in some embodiments.

In some embodiments, transistor 400 may be used within driver $D_1$ and transistor 450 may be used within driver $D_1'$. In such embodiments, the thickness $T_D$ of dielectric 402 may be lower than the thickness $T_D'$ of dielectric 452. For example, $T_D$ may be at least two times lower than $T_D'$, at least three times lower than $T_D'$, at least five times lower than $T_D'$, at least ten times lower than $T_D'$, or at least twenty times lower than $T_D'$.

Referring back to FIG. 2, the capacitor $C_1$ may be used to retain the charge provided by driver $D_1'$, while providing a path for signal $V_A$. Capacitor $C_1$ may also block the direct current (DC) component of signal $V_A$. Accordingly, signal $V_C$ may have a DC component provided by driver $D_1'$ and time-varying frequency components provided by driver $D_1$.

Figure 3D:
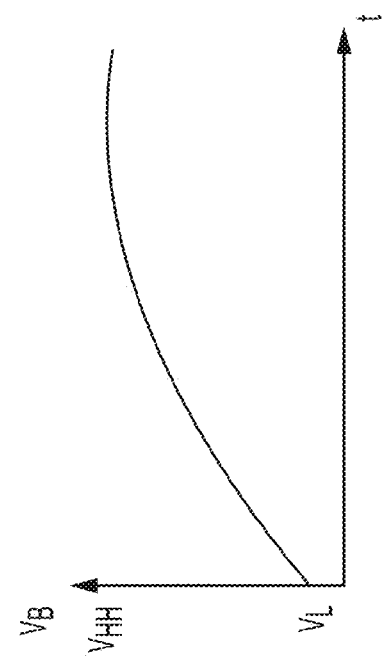
FIG. 3D is a plot illustrating an exemplary waveform provided at node C of the line driver of FIG. 2, according to some embodiments.

By combining a fast signal $V_A$, toggling between $V_{LL}$ and $V_H$, and a slowly varying signal $V_B$, the resulting signal $V_C$ may track $V_A$ while toggling between $V_L$ and $V_{HH}$. FIG. 3D illustrates a non-limiting example of $V_C$ in response to $V_{in}^-$. As illustrated, capacitor $C_1$, used in combination with drivers $D_1$ and $D_1'$, may effectively operate as a level shifter receiving $V_{LL}$ and $V_H$ as inputs, and providing $V_L$ and $V_{HH}$ as outputs.

When $V_C$ is equal to $V_L$, the source/gate voltage of transistor $M_1$ may be equal $V_{HH}-V_C=V_{HH}-V_L$. Since $V_{HH}-V_L$ is within the rating range of the transistor, transistor $M_1$ may operate without experiencing stress.

By way of example and not limitation, $V_{LL}=0$, $V_L=0.25V$, $V_H=0.75V$ and $V_{HH}=1V$, and $V_{in}^+$ and $V_{in}^-$ may toggle between $V_{LL}$, representing a logic 0, and 0.75V, representing a logic 1. According to such example, the transistors $M_1$-$M_4$ of line driver 200 may be configured to withstand voltages between the gate and the source, having an absolute value equal to or less than 0.75V. When $V_{in}^-$ is equal to 0, $V_A$ may be equal to 0 and $V_C$ may be equal to 0.25V. Accordingly, the source/gate voltage of transistor $M_1$ is equal to 1V-0.25V=0.75V. In this case the source/gate voltage of transistor $M_1$ is within the rating range of the transistor, and transistor $M_1$ may operate without experiencing stress. Fast control path and a slow control path act as a level shifter, shifting a 0 logic from 0 to 0.25V, thus maintain the source/gate voltage of transistor $M_1$ below 0.75V.

When $V_{in}^-$ is equal to 0.75V, $V_A$ may be equal to 0.75 and $V_C$ may be equal to 1V. Accordingly, the source/gate voltage of transistor $M_1$ is equal to 1V-1V=0. In this case the source/gate voltage of transistor $M_1$ may cause transistor M1 to be in an off state without experiencing current leakage. Fast control path and a slow control path act as a level shifter, shifting a 1 logic from 0.75 to 1V, thus maintain the source/gate voltage of transistor $M_1$ to 0.

Drivers $D_2$, and $D_2'$ and capacitor $C_2$ may receive signal $V_{in}^+$ and may be configured to operate in the same manner as described in connection with drivers $D_1$, and $D_1'$ and capacitor $C_1$.

Line driver 200 may exhibit one of two possible states. The first state occurs when $V_{in}^-$ is equal to a logic 0 and $V_{in}^+$ is equal to a logic 1. In such a circumstance, the gate of transistor $M_1$ my receive a voltage equal to $V_L$, thus placing transistor $M_1$ in an on state. The gate of transistor $M_2$ my receive a voltage equal to $V_{HH}$, thus placing transistor $M_2$ in an off state. The gate of transistor $M_3$ my receive a voltage equal to $V_{LL}$, thus placing transistor $M_3$ in an off state. The gate of transistor $M_4$ my receive a voltage equal to $V_H$, thus placing transistor $M_4$ in an on state. Since $M_1$ and $M_4$ are in an on state, a current may flow through transistor $M_1$, resistor $R_1$, resistor $R_{out}$, resistor $R_4$ and transistor $M_4$. In some embodiments, resistors $R_1$ and $R_4$ may exhibit equal resistances, and such resistance may be equal to half of the resistance associated with $R_{out}$. In such embodiments, the output voltage $V_{out}^+-V_{out}^-$ may be equal to $(V_{HH}-V_{LL})/2$. Referring back to the non-limiting example provided above, $V_{out}^+-V_{out}^-=0.75V-0.25V=0.5V$.

The second state occurs when $V_{in}^-$ is equal to a logic 1 and $V_{in}^+$ is equal to a logic 0. In such a circumstance, the gate of transistor $M_1$ my receive a voltage equal to $V_{HH}$, thus placing transistor $M_1$ in an off state. The gate of transistor $M_2$ my receive a voltage equal to $V_L$, thus placing transistor $M_2$ in an on state. The gate of transistor $M_3$ my receive a voltage equal to $V_H$, thus placing transistor $M_3$ in an on state. The gate of transistor $M_4$ my receive a voltage equal to $V_{LL}$, thus placing transistor $M_4$ in an off state. Since $M_2$ and $M_3$ are in an on state, a current may flow through transistor $M_2$, resistor $R_2$, resistor $R_{out}$, resistor $R_3$ and transistor $M_3$. In some embodiments, resistors $R_2$ and $R_3$ may exhibit equal resistances, and such resistance may be equal to half of the resistance associated with $R_{out}$. In such embodiments, the output voltage $V_{out}^+-V_{out}^-$ may be equal to $-(V_{HH}-V_{LL})/2$. Referring back to the non-limiting example provided above, $V_{out}^+-V_{out}^-=-(0.75V-0.25V)=-0.5V$, thus providing a 1Vpp as desired.

In some circumstances, it may be desirable to implement drivers $D_1'$ and $D_2'$ without resorting to transistors having different gate dielectric thicknesses. For example, some fabrication processes may provide process design kits (PDK) having only one type of transistor, such that all the transistors have the same gate dielectric thickness.

Figure 5:
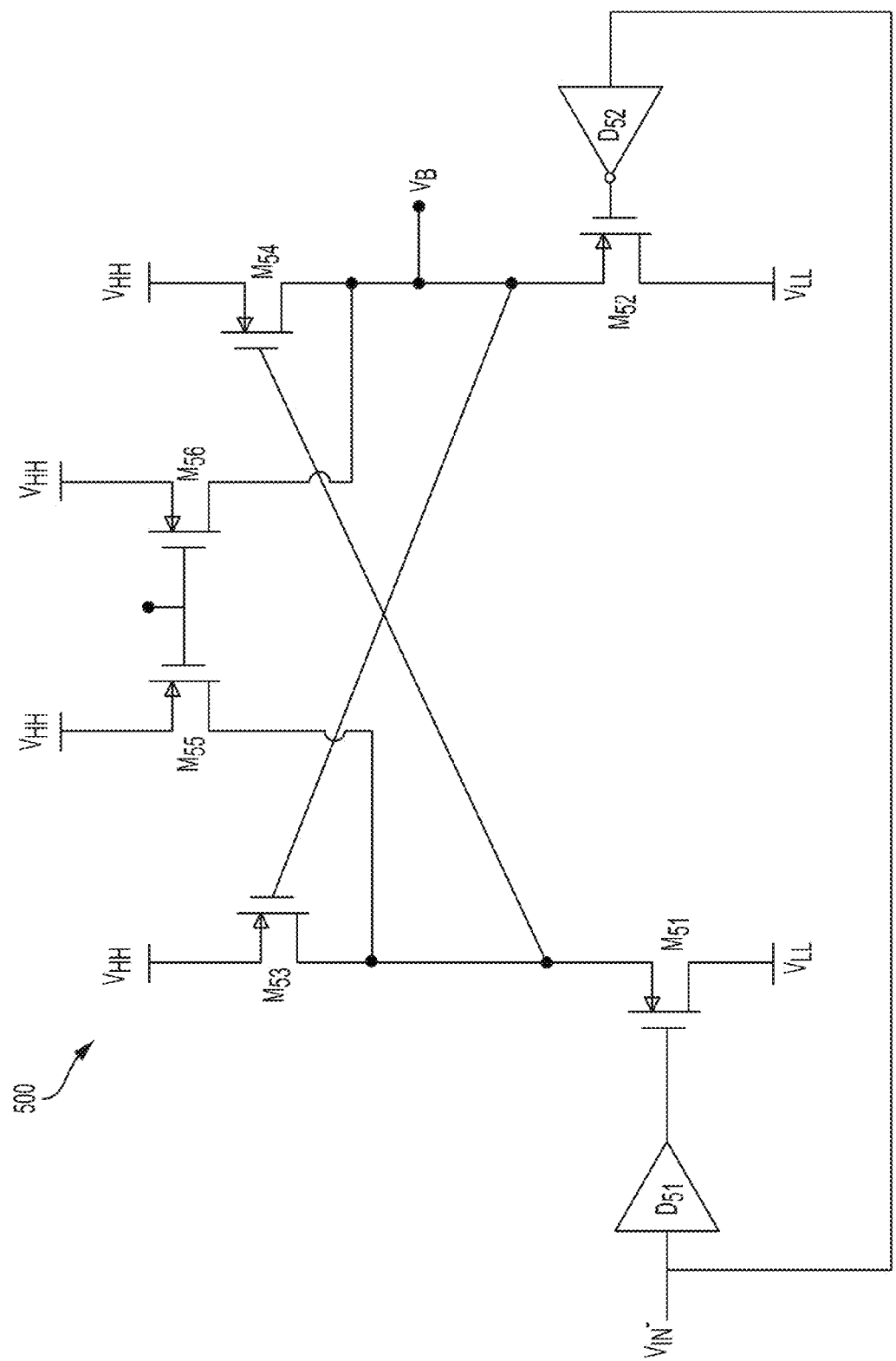
FIG. 5 is a circuit diagram illustrating an exemplary latch circuit, according to some embodiments.

In some embodiments, driver $D_1'$ (and/or $D_2'$) may be implemented using a latch circuit. FIG. 5 illustrates an exemplary latch circuit, according to some embodiments. Latch circuit 500 may comprise transistors $M_{51}$, $M_{52}$, $M_{53}$, $M_{54}$, $M_{55}$ and $M_{56}$. In some embodiments, the transistors may be PMOS transistors. However, other types of transistors may be used. The drain terminals of transistors $M_{51}$ and $M_{52}$ may be coupled to a voltage supply $V_{LL}$, such as a ground terminal. The source terminals of transistors $M_{51}$ and $M_{52}$ may be coupled to the drain terminals of transistors $M_{53}$ and $M_{54}$ respectively. The source terminals of transistors $M_{53}$ and $M_{54}$ may be coupled to a supply voltage $V_{HH}$. The gate terminals of transistor $M_{53}$ and $M_{54}$ may be coupled to the source terminals of transistors $M_{52}$ and $M_{51}$ respectively. In some embodiments, the drain terminal of transistor $M_{53}$ may be coupled to the drain terminal of transistor $M_{55}$, and the drain terminal of transistor $M_{54}$ may be coupled to the drain terminal of transistor $M_{56}$. The gate terminals of transistors $M_{55}$ and $M_{56}$ may be coupled together. The source terminals of transistors $M_{55}$ and $M_{56}$ may be coupled to a supply voltage $V_{HH}$.

The gate terminal of transistor $M_{51}$ may be driven by signal $V_{in}^-$ through driver $D_{51}$. The gate terminal of transistor $M_{52}$ may be driven by an inverted version of signal $V_{in}^-$ through inverter driver $D_{52}$. When $V_{in}^-$ switches from a logic 0 to a logic 1, transistor $M_{51}$ may switch to an off state, and transistor $M_{52}$ may switch to an on state. As a current flows through transistors $M_{52}$ and $M_{54}$, the voltage at the drain terminal of transistor $M_{52}$ may charge the capacitance associated with the gate terminal of transistor $M_{53}$. Consequently the voltage $V_B$ may slowly increase. Contrarily, when $V_{in}^-$ switches from a logic 1 to a logic 0, transistor $M_{51}$ may switch to an on state, and transistor $M_{52}$ may switch to an off state. As a current flows through transistor $M_{51}$ and $M_{53}$, the voltage at the drain terminal of transistor $M_{51}$ may charge the capacitance associated with the gate terminal of transistor $M_{54}$. At the same time, the capacitance associated with the gate terminal of transistor $M_{53}$ may discharge. Consequently the voltage $V_B$ may slowly decay. In some embodiments, latch circuit 500 may be configured to provide a voltage $V_B$ equal to the moving average of signal $V_{in}^-$.

Figure 6:
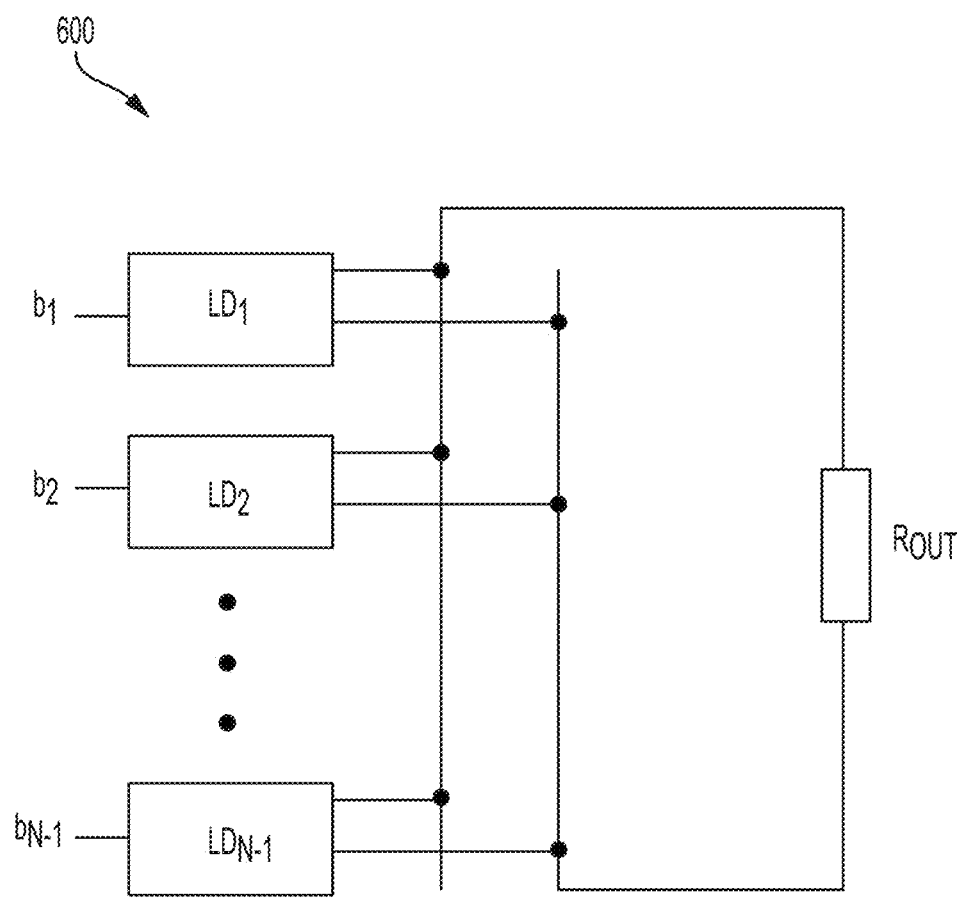
FIG. 6 is a block diagram illustrating an exemplary digital-to-analog converter (DAC), according to some embodiments.

In some embodiments, a line driver of the type described herein may be used in a digital-to-analog converter (DAC). The DAC may comprise a plurality of cells. For example, the DAC may comprise one cell for each bit of a digital word to be converted. FIG. 6 is a block diagram illustrating an exemplary DAC, according to some embodiments. DAC 600 may comprise a plurality of line drivers $LD_1$, $LD_2$ ... $LD_{N-1}$. One or more such line drivers may be implemented using line driver 200. Each line driver may be configured to receive a corresponding digital signal, which may be represented by a series of bits $b_1, b_2 \ldots b_{N-1}$. Each line driver may be configured to drive resistor $R_{out}$, which may represent the resistance of a transmission line. In some embodiments, a resistive ladder may be used to perform the digital-to-analog conversion. For example, for each line driver, the resistors $R_1$, $R_2$, $R_3$ and $R_4$ may be configured to provide an output having a desired weight. Alternatively, or additionally, a transistor ladder may be used. For example, for each line driver, the size of transistors $M_1$, $M_2$, $M_3$ and $M_4$, such as the width and/or length of the drain and/or source, may be configured to provide a weighted output.

The embodiments described herein may be used to drive transmission lines with peak-to-peak voltages greater than the maximum voltage that a transistor can withstand for a given fabrication node. Thanks to such line drivers, designers of electronic circuits may have the freedom to choose fabrication nodes that can provide a data rate sufficient for the specific application. For example, the embodiments described herein may be used to drive transmission lines at data rates exceeding 20 Gbit/s, 25 Gbit/s, 30 Gbit/s, 35 Gbit/s, 40 Gbit/s, 45 Gbit/s, 50 Gbit/s, 55 Gbit/s or 60 Gbit/s.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A circuit comprising:
   a first transistor having a first control terminal and a first output terminal;
   a second transistor having a second control terminal and a second output terminal;
   a third transistor having a third output terminal coupled to the first output terminal;
   a fourth transistor having a fourth output terminal coupled to the second output terminal;
   a first driving stage connected to the first control terminal, the first driving stage comprising a first driver having a first speed and a second driver having a second speed slower than the first speed; and
   a second driving stage connected to the second control terminal, the second driving stage comprising a third driver having a third speed and a fourth driver having a fourth speed slower than the third speed.

2. The circuit of claim 1, wherein the first driver comprises at least one fifth transistor having a first gate dielectric, the first gate dielectric having a first thickness, and the second driver comprises at least one sixth transistor having a second gate dielectric, the second gate dielectric having a second thickness higher than the first thickness.

3. The circuit of claim 1, wherein the first driver is connected to the first control terminal through a first capacitor and the third driver is connected to the second control terminal through a second capacitor.

4. The circuit of claim 1, wherein the first and second transistors are PMOS transistors, and the third and fourth transistors are NMOS transistors.

5. The circuit of claim 1, wherein the first output terminal is configured to be coupled to a first input terminal of a transmission line and the second output terminal is configured to be coupled to a second input terminal of the transmission line.

6. The circuit of claim 5, wherein the first and the second output terminals are configured to provide a differential signal to the transmission line.

7. The circuit of claim 1, further comprising a fifth driver coupled to the third transistor and a sixth driver coupled to the fourth transistor.

8. The circuit of claim 1, wherein the first driver is configured to receive a first supply voltage and a second supply voltage lower than the first supply voltage, and the second driver is configured to receive a third supply voltage and a fourth supply voltage lower than the third supply voltage, wherein the third supply voltage is higher than the first supply voltage and the fourth supply voltage is higher than the second supply voltage.

9. The circuit of claim 8, wherein the first and second transistors are configured to receive the third supply voltage, and the third and fourth transistors are configured to receive the second supply voltage.

10. The circuit of claim 8, further comprising a fifth driver coupled to the third transistor and a sixth driver coupled to the fourth transistor, wherein the fifth and the sixth drivers are configured to receive the first supply voltage and the second supply voltage.

11. The circuit of claim 1, wherein the first driving stage in coupled to an input terminal and the second driving stage is coupled to the input terminal through an inverter.

12. The circuit of claim 1, wherein the second driver comprises latch circuit.

13. A circuit for driving a transmission line, the circuit comprising:
 a first transistor having a control terminal and a first output terminal;
 a second transistor having a second output terminal coupled to the first output terminal; and
 a driving stage connected to the control terminal, the driving stage comprising a first driver having a first speed and a second driver having a second speed slower than the first speed.

14. The circuit of claim 13, wherein the first driver and the second driver are configured to receive a common input signal.

15. The circuit of claim 13, wherein the first driver comprises at least one fifth transistor having a first gate dielectric, the first gate dielectric having a first thickness and the second driver comprises at least one sixth transistor having a second gate dielectric, the second gate dielectric having a second thickness higher than the first thickness.

16. The circuit of claim 13, wherein the first driver is connected to the control terminal through a capacitor.

17. The circuit of claim 13, wherein the first transistor is a PMOS transistor, and the second transistor is an NMOS transistor.

18. The circuit of claim 13, wherein the first driver is configured to receive a first supply voltage and a second supply voltage lower than the first supply voltage, and the second driver is configured to receive a third supply voltage and a fourth supply voltage lower than the third supply voltage, wherein the third supply voltage is higher than the first supply voltage and the fourth supply voltage is higher than the second supply voltage.

19. The circuit of claim 17, wherein the first transistor is configured to receive the third supply voltage, and the second transistor is configured to receive the second supply voltage.

20. The circuit of claim 17, further comprising a third driver coupled to the second transistor, wherein the third driver is configured to receive the first supply voltage and the second supply voltage.

* * * * *